United States Patent
Akhavain et al.

(10) Patent No.: US 6,951,778 B2
(45) Date of Patent: Oct. 4, 2005

(54) EDGE-SEALED SUBSTRATES AND METHODS FOR EFFECTING THE SAME

(75) Inventors: Mohammad Akhavain, Escondido, CA (US); Stanley G. Markwell, Escondido, CA (US); Janis Horvath, San Diego, CA (US); Joseph E. Scheffelin, Poway, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 235 days.

(21) Appl. No.: 10/284,825

(22) Filed: Oct. 31, 2002

(65) Prior Publication Data

US 2004/0087063 A1 May 6, 2004

(51) Int. Cl.[7] .............................................. H01L 21/48
(52) U.S. Cl. ........................................ 438/127; 438/106
(58) Field of Search ............................ 438/21, 106, 112, 438/124, 126, 127

(56) References Cited

U.S. PATENT DOCUMENTS

| | | |
|---|---|---|
| 4,159,221 A | 6/1979 | Schuessler |
| 4,500,945 A | 2/1985 | Lipschutz |
| 4,572,757 A | 2/1986 | Spadafora |
| 4,784,974 A | 11/1988 | Butt |
| 5,041,695 A | 8/1991 | Olenick et al. |
| 5,231,304 A | 7/1993 | Solomon |
| 5,258,781 A | 11/1993 | John |
| 5,268,814 A | 12/1993 | Yakubowski |
| 5,278,584 A | 1/1994 | Keefe et al. |
| 5,281,151 A | 1/1994 | Arima et al. |
| 5,297,331 A | 3/1994 | Childers |
| 5,412,247 A | 5/1995 | Martin |
| 5,422,667 A | 6/1995 | Daggs et al. |
| 5,442,384 A | 8/1995 | Schantz et al. |
| 5,450,113 A | 9/1995 | Childers et al. |
| 5,467,115 A | 11/1995 | Childers |
| 5,482,735 A | 1/1996 | Miyauchi et al. |
| 5,568,171 A | 10/1996 | Keefe et al. |
| 5,599,414 A | 2/1997 | Roethlingshoefer et al. |
| 5,635,966 A | 6/1997 | Keefe et al. |
| 5,638,101 A | 6/1997 | Keefe et al. |
| 5,648,805 A | 7/1997 | Keefe et al. |
| 5,702,985 A | 12/1997 | Burns |
| 5,733,382 A | 3/1998 | Hanoka |
| 5,736,998 A | 4/1998 | Caren et al. |
| 5,755,032 A | 5/1998 | Pan et al. |
| 5,852,460 A | 12/1998 | Schaeffer et al. |
| 5,854,085 A | 12/1998 | Raab et al. |
| 5,903,044 A | 5/1999 | Farnworth et al. |
| 6,241,340 B1 | 6/2001 | Watanabe et al. |
| 6,267,472 B1 | 7/2001 | Maher et al. |
| 6,322,200 B1 | 11/2001 | Feinn et al. |
| 6,325,491 B1 | 12/2001 | Feinn |
| 6,341,845 B1 | 1/2002 | Scheffelin et al. |
| 6,357,864 B1 | 3/2002 | Sullivan et al. |
| 6,397,465 B1 | 6/2002 | Akhavain et al. |
| 6,406,778 B1 | 6/2002 | Natarajan et al. |
| 6,406,942 B2 * | 6/2002 | Honda ......................... 438/119 |
| 6,423,622 B1 * | 7/2002 | Chen et al. .................. 438/598 |
| 6,582,993 B1 * | 6/2003 | Baba et al. .................. 438/118 |
| 6,613,449 B2 * | 9/2003 | Yamaguchi et al. ......... 428/620 |

* cited by examiner

Primary Examiner—Michael Lebentritt
Assistant Examiner—Scott Geyer

(57) ABSTRACT

Methods and systems of protecting substrates that are intended for use in fluidic devices are described. In accordance with one embodiment, sealant material is applied over one or more edges of at least one multi-chip module substrate that is intended for use in a fluidic device. At least one edge has an exposed electrical interconnect and the sealant material is applied over less than an entirety of the substrate and sufficiently to cover the exposed electrical interconnect. The sealant material is exposed to conditions effective to seal the one or more edges.

13 Claims, 7 Drawing Sheets

EDGE-SEALED SUBSTRATES AND METHODS FOR EFFECTING THE SAME

TECHNICAL FIELD

This invention relates to substrate systems and methods for processing substrates intended for use in fluidic devices.

BACKGROUND

Substrates such as multi-layer ceramic (MLC) structures are used in the production of electronic devices. Often times these substrates are employed in a fluidic device. This invention arose out of concerns associated with providing methods and systems for protecting such substrates.

SUMMARY

Methods and systems of protecting substrates that are intended for use in fluidic devices are described. In accordance with one embodiment, sealant material is applied over one or more edges of at least one multi-chip module substrate. At least one edge has an exposed electrical interconnect and the sealant material is applied over less than an entirety of the substrate and sufficiently to cover the exposed electrical interconnect. The sealant material is exposed to conditions effective to seal the one or more edges.

DETAILED DESCRIPTION

Overview

Methods and systems for protecting substrates that are intended for use in fluidic devices, such as fluid ejection devices, are described. One exemplary type of substrate that can be used in a fluid ejection device is a multi-chip module substrate such as a multi-layer substrate, for example, a multi-layer ceramic substrate or "MLC". MLCs can have various layering configurations. For example, a MLC circuit substrate may comprise patterned metal layers which act as electrical conductors sandwiched in between ceramic layers which act as an insulator medium. For the purposes of interlayer interconnections, most of the ceramic layers have tiny holes or via holes. Prior to lamination, the via holes are filled with an electrically conductive paste, such as a metallic paste, and sintered to form vias which provide the electrical connection between the layers. In addition, the MLC substrates may have termination pads for attaching semiconductor chips, connector leads, capacitors, resistors, to name a few.

Figure 1:
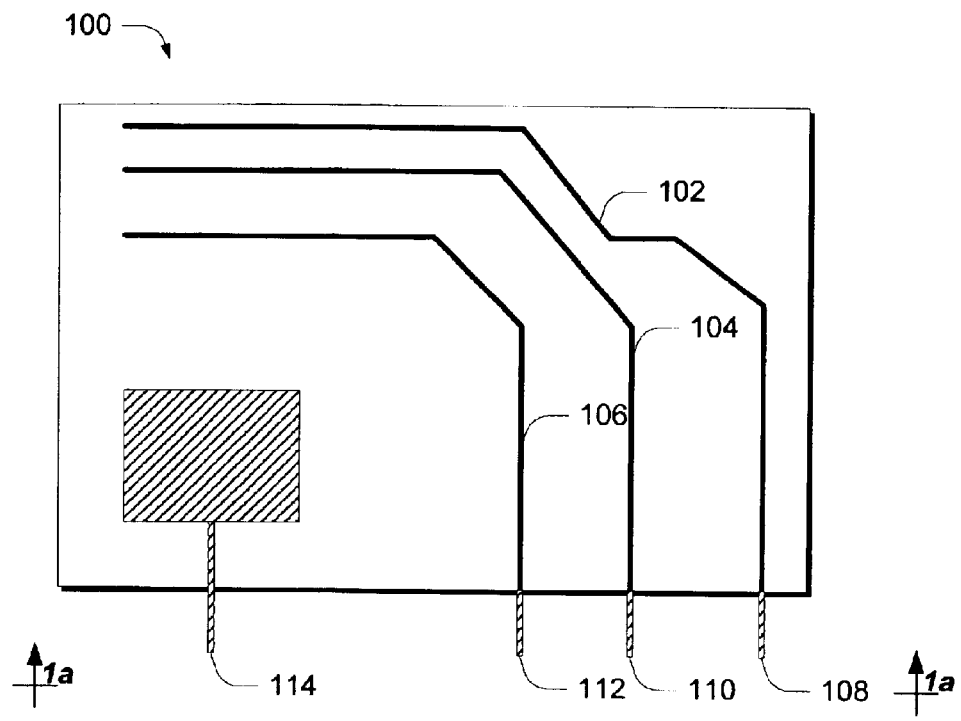
FIG. 1 is a diagram of an exemplary substrate that can be utilized in connection with the described embodiments.
Figure 1A:
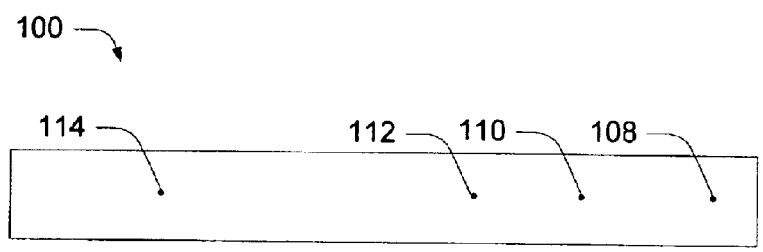
FIG. 1a is an elevational view taken along line 1a—1a in FIG. 1.

In one embodiment, electrolytic plating processes have been used to plate nickel and gold over metal traces, such as tungsten, on ceramic packages. As an example, consider FIG. 1. There, a MLC substrate 100 is shown with tungsten traces 102, 104, and 106. Electrolytic plating can typically use tie bars, examples of which are shown at 108, 110, 112, and 114. Tie bars are traces that are extended beyond the active edge of the ceramic package and are used to short all internal traces. To electrolytically plate nickel or gold over the illustrated traces, the tie bars are used to suspend the substrate in a bath where it is exposed to electrolytic conditions effective to plate material over the traces. Tie bars 108–114 are then snapped off after the plating process leaving exposed metal traces at the edge of the ceramic substrate. Such is more apparent from FIG. 1a which is an elevational view of the FIG. 1 substrate taken along line 1a—1a in FIG. 1.

One type of fluid ejection device is an ink jet printer. Inkjet printing technology has become widely known and is often implemented using a thermal ink propulsion mechanism. Such technology forms characters and images on a medium, such as paper, by expelling drops of ink in a controlled fashion so that the drops land on the medium. In its simplest form, the printer can be understood as a working combination of a mechanism for moving and placing the medium in a position such that the ink drops can be placed on the medium, and a print cartridge which controls the flow of ink, and selectively ejects drops of ink onto the medium. In one embodiment, the printer includes appropriate controlling hardware and software to position the medium and eject droplets so that a desired graphic is formed on the medium.

A conventional print cartridge for an inkjet printer comprises an ink containment device and an ink ejection assembly which selectively heats and expels ink drops in a controlled fashion. An alternative ink ejection apparatus for other than thermal inkjet printers uses mechanical propulsion techniques such as piezo-electric drivers to impart momentum to the ink. For thermal inkjet printers, in accordance with one embodiment, the ink ejection assembly includes a laminate structure comprising a semiconductor or insulator substrate (e.g. a multi-layer ceramic substrate) capped with a plate or surface permeated by orifices or nozzles arranged in a pattern beneficial to the deposition of ink on a medium. In thermal inkjet printers, the heating and expulsion mechanism consists of a plurality of heater resistors formed on or otherwise supported by the semiconductor, each heater resistor associated with one of the nozzles in the nozzle plate. Ink is stored in an ink reservoir in the print cartridge, in most implementations, and is typically loaded into a firing chamber which is disposed about the heater resistor. Each of the heater resistors is coupled to the controlling hardware and software of the printer such that each of the resistors may be independently energized to quickly vaporize a portion of ink and expel a drop of ink from the nozzle.

In one embodiment, the substrate utilized for the ink ejection assembly is machinable or otherwise formable to allow formation of ink slots, when desirable, and channels, and other openings such as those which would accommodate mounting of ink ejectors from an inside surface. In one embodiment, the substrate is able to receive solder and adhesives, provide interconnect vias and layers, and is able to receive mounting of integrated circuits. For additional background on multi-layer ceramic substrates, the reader is referred to U.S. Pat. No. 6,325,488, assigned to the assignee of this document.

As some background on multi-layer substrates and particularly those employed in the context of inkjet printers, consider the following.

Figure 1B:
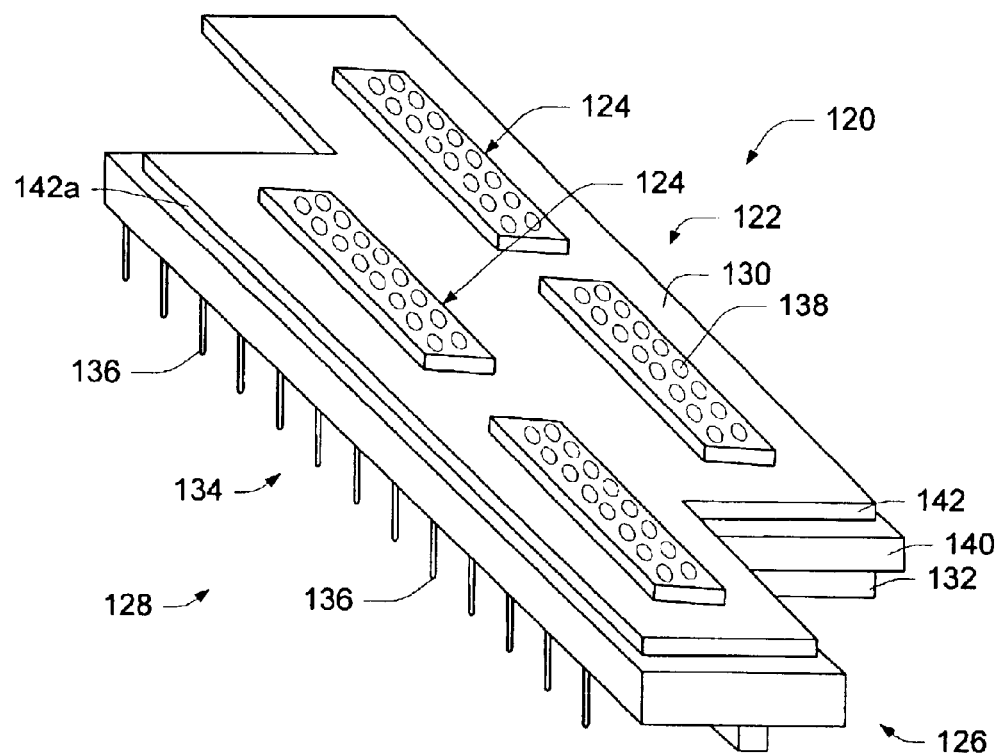
FIG. 1b is a top perspective view of an inkjet printhead assembly including a plurality of printhead dies according to one embodiment.

FIG. 1b illustrates one embodiment of a portion of an inkjet printhead assembly 120. Inkjet printhead assembly 120 is, in this example, a wide-array or multi-head printhead assembly and includes a carrier 122, a plurality of printhead dies 124, an ink delivery system 126, and an electronic interface system 128. Carrier 122 has a first side 130 and a second side (not specifically designated) which is opposite of and oriented substantially parallel with first side 130. Carrier 122 serves to carry or provide mechanical support for printhead dies 124 and provide fluidic communication between printhead dies 124 and an ink supply assembly via ink delivery system 126. In addition, carrier 122 provides electrical communication between printhead dies 124 and an electronic controller via electronic interface system 128.

Printhead dies 124 are mounted on first side 130 of carrier 122 and aligned in one or more rows. In one embodiment, printhead dies 124 are spaced apart and staggered such that printhead dies 124 in one row overlap at least one printhead die 124 in another row. Thus, inkjet printhead assembly 120 may span a nominal page width or a width shorter or longer than nominal page width. In one embodiment, a plurality of inkjet printhead assemblies 120 are mounted in an end-to-end manner. Carrier 122, therefore, has a staggered or stair-step profile. Thus, at least one printhead die 124 of one inkjet printhead assembly 120 overlaps at least one printhead die 124 of an adjacent inkjet printhead assembly 12. While four printhead dies 124 are illustrated as being mounted on carrier 122, the number of printhead dies 124 mounted on carrier 122 may vary.

Ink delivery system 126 fluidically couples an ink supply assembly (not specifically shown) with printhead dies 124. In one embodiment, ink delivery system 126 includes a manifold 132 and a port (not specifically shown). Manifold 132 is mounted on the second side of carrier 122 and distributes ink through carrier 122 to each printhead die 124. The port communicates with manifold 132 and provides an inlet for ink supplied by the ink supply assembly. In one embodiment, manifold 132 is formed of plastic and is chemically compatible with liquid ink so as to accommodate fluid delivery.

Electronic interface system 128 electrically couples the electronic controller with printhead dies 124. More specifically, electronic interface system 128 communicates electrical signals between the electronic controller and printhead dies 124. As such, electronic interface system 128 communicates power, ground, and data signals between the electronic controller and printhead dies 124 of inkjet printhead assembly 120.

In one embodiment, electronic interface system 128 includes an electrical interconnect 134 which forms an input/output (I/O) interface for inkjet printhead assembly 120. As such, electrical interconnect 134 communicates electrical signals between the electronic controller and inkjet printhead assembly 120. Examples of electrical interconnect 134 include I/O pins 136, as illustrated in FIG. 1b, which engage corresponding I/O receptacles electrically coupled to the electronic controller and I/O contact pads or fingers which mechanically or inductively contact corresponding electrical nodes electrically coupled to the electronic controller. Since the electronic controller communicates with a mounting assembly, electrical interconnect 134 facilitates electrical coupling between the electronic controller and inkjet printhead assembly 120 when inkjet printhead assembly 120 is mounted in the mounting assembly.

As illustrated in FIG. 1b, each printhead die 124 includes an array of printing or drop ejecting elements 138. Printing elements 138 are formed on a substrate which has an ink feed slot formed therein. As such, the ink feed slot provides a supply of liquid ink to printing elements 138. Each printing element 138 includes a thin-film structure, an orifice layer, and a firing resistor. The thin-film structure has an ink feed channel formed therein which communicates with the ink feed slot of the substrate. The orifice layer has a front face and a nozzle opening formed in the front face. The orifice layer also has a nozzle chamber formed therein which communicates with the nozzle opening and an ink feed channel of the thin-film structure. The firing resistor is positioned within the nozzle chamber and includes leads which electrically couple the firing resistor to a drive signal and ground.

During printing, ink flows from the ink feed slot to the nozzle chamber via an ink feed channel. The nozzle opening is operatively associated with the firing resistor such that droplets of ink within the nozzle chamber are ejected through the nozzle opening and toward a print medium upon energization of the firing resistor.

In one embodiment, carrier 122 includes a substructure 140 and a multi-layer substrate 142. Substructure 140 and multi-layer substrate 142 both provide and/or accommodate mechanical, electrical, and fluidic functions of inkjet printhead assembly 120. More specifically, substructure 140 provides mechanical support for multi-layer substrate 142, accommodates fluidic communication between an ink supply assembly and printhead dies 124 via ink delivery system 126, and accommodates electrical connection between printhead dies 124 and the electronic controller via electronic interface system 128. Multilayer substrate 142, however, provides mechanical support for printhead dies 124, accommodates fluidic communication between the ink supply assembly and printhead dies 124 via ink delivery system 126, and provides electrical connection between and among printhead dies 124 and the electronic controller via electronic interface system 128. In the illustrated example, edge 142a which runs lengthwise with pins 136 corresponds to the edge in FIGS. 1 and 1a that would, without the embodiments described herein, typically have exposed traces.

Substructure 140 has a first side and a second side which is opposite the first side. In one embodiment, multi-layer substrate 142 is disposed on the first side and ink manifold 132 is disposed on the second side. As such, multi-layer substrate 142 and ink manifold 132 are both secured to substructure 140. While substructure 140 and ink manifold 132 are illustrated as being formed separately, it is within the scope of the disclosed subject matter for substructure 140 and ink manifold 132 to be formed as one unitary structure.

In one embodiment, substructure 140 is formed of plastic. Substructure 140 is formed, for example, of a high performance plastic such as fiber reinforced noryl. It is, however, within the scope of the disclosed subject matter for substructure 140 to be formed of silicon, stainless steel, or other suitable material or combination of materials. Preferably, substructure 140 is chemically compatible with liquid ink so as to accommodate fluidic routing.

Figure 1C:
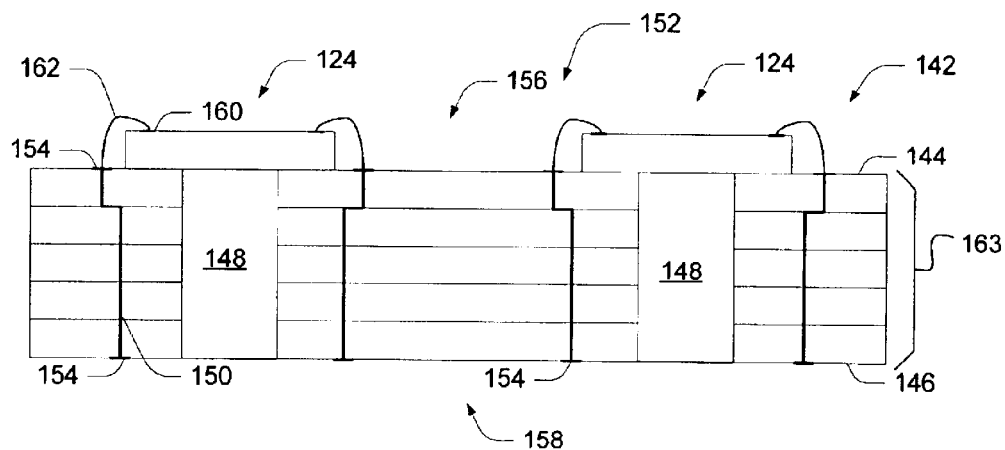
FIG. 1c is a schematic cross-sectional view of a multi-layer substrate in accordance with one embodiment.

As shown in FIGS. 1b and 1c, multi-layer substrate 142 has a first side 144 and a second side 146 which is opposite first side 144. In one embodiment, printhead dies 124 are disposed on first side 144 and substructure 140 is disposed on second side 146. Second side 146 of multi-layer substrate 142, therefore, contacts the first side of substructure 140 when multi-layer substrate 142 is mounted on substructure 140.

For transferring ink between the ink supply assembly and printhead dies 124, substructure 140 and multi-layer substrate 142 each have at least one ink passage formed therein. FIG. 1c shows ink passage 148 as extending through multi-layer substrate 142 and providing a through-channel or through-opening for delivery of ink to printhead dies 124 from manifold 132 via the ink passage of substructure 140.

In one embodiment, one end of the substructure's ink passage communicates with manifold 132 of ink delivery system 126, and another end of the ink passage communicates with ink passage 148. In addition, one end of ink passage 148 communicates with the substructure's ink passage, and another end of ink passage 148 communicates with printhead dies 124 and, more specifically, an ink feed slot. As such, the ink passages form a portion of the ink delivery system. Although only one ink passage 148 is shown for a given printhead die 124, there may be additional ink passages to the same printhead die, for example, to provide ink of respective differing colors.

As illustrated in FIG. 1c, the electronic interface system includes a plurality of conductive paths 150 extending through multi-layer substrate 142. More specifically, multi-layer substrate 142 includes conductive paths 150 which pass through and terminate at exposed surfaces of multi-layer substrate 142. As such, conductive paths 150 define an electrical circuit 152 of inkjet printhead assembly 120. Electrical circuit 152, therefore, is formed in multi-layer substrate 142 of carrier 122.

Electrical circuit 152 communicates electrical signals between the electronic controller and printhead dies 124. More specifically, electrical circuit 152 facilitates the communication of power, ground, and data signals among and/or between printhead dies 124 and the electrical controller. In one embodiment, data includes print data and non-print data. Print data includes, for example, nozzle data containing pixel information such as bitmap print data. Non-print data includes, for example, command/status (CS) data, clock data, and/or synchronization data. Status data of CS data includes, for example, printhead temperature or position, print resolution, and/or error notification.

In one embodiment, conductive paths 150 include electrical contact pads 154 at terminal ends thereof which form, for example, I/O bond pads on multilayer substrate 142. Conductive paths 150, therefore, terminate at and provide electrical coupling between electrical contact pads 154. Electrical contact pads 154 define a first interface 156 and a second interface 158 of multi-layer substrate 142. As such, first interface 156 and second interface 158 provide points for electrical connection to multi-layer substrate 142 and, more specifically, conductive paths 150.

In one embodiment, printhead dies 124 include electrical contacts 160 which form I/O bond pads. As such, electronic interface system 128 includes electrical connectors, for example, wire bond leads 162, which electrically couple electrical contact pads 154 of first interface 156 with electrical contacts 160 of printhead dies 124.

In one embodiment, conductive paths 150 terminate at first side 144 and second side 146 of multi-layer substrate 142. Thus, electrical contact pads 154 are provided on first side 144 and second side 146 of multi-layer substrate 142. As such, conductive paths 150 provide electrical coupling between electrical contact pads 154 on second side 146 of multi-layer substrate 142 and electrical contact pads 154 on first side 144 of multi-layer substrate 142. First interface 156 and second interface 158, therefore, are provided on first side 144 and second side 146, respectively. Accordingly, electrical interconnect 134 is electrically coupled to electrical contact pads 154 provided on second side 146 and wire bond leads 162 are electrically coupled at one end to electrical contact pads 154 provided on first side 144 and at another end to electrical contacts 160 of printhead dies 124.

By providing second interface 158 on second side 146 of multi-layer substrate 142, the number of electrical connections on first side 144 of multi-layer substrate 142 is minimized. In one embodiment, the only electrical connections on first side 144 of multi-layer substrate 142 are those made between first interface 156 and printhead dies 124. As such, electrical connections between second interface 158 and electrical interconnect 134 are provided away from the print zone and, more specifically, away from ink mist or spray which may be generated as ink drops are ejected from the nozzles during printing. Thus, electrical connections between electrical interconnect 134 and electrical contact pads 154 are protected from possible ink ingression.

While conductive paths 150 are illustrated as terminating at first side 144 and second side 146 of multi-layer substrate 142, it is, however, within the scope of the described subject matter for conductive paths 150 to terminate at other sides of multi-layer substrate 142. In addition, one or more conductive paths 150 may branch from and/or lead to one or more other conductive paths 150. Furthermore, one or more conductive paths 150 may begin and/or end within multi-layer substrate 142.

Figure 1D:
FIG. 1d is a schematic cross-sectional view of a portion of the multi-layer substrate of FIG. 1c.

As illustrated in FIGS. 1c and 1d, multi-layer substrate 142 is formed of multiple layers 163. In one embodiment, layers 163 include a plurality of conductive layers 164 and a plurality of non-conductive or insulative layers 166. Conductive layers 164 are formed, for example, by patterned traces of conductive material on insulative layers 166. As such, at least one insulative layer 166 is interposed between two conductive layers 164. Conductive layers 164 include, for example, a power layer 168, a data layer 170, and a ground layer 172. Thus, power layer 168 conducts power for printhead dies 124, data layer 170 carries data for printhead dies 124, and ground layer 172 provides grounding for printhead dies 124.

Power layer 168, data layer 170, and ground layer 172 individually form portions of conductive paths 150 through multi-layer substrate 142. Thus, power layer 168, data layer 170 and ground layer 172 are each electrically coupled to first interface 156 and second interface 158 of multi-layer substrate 142 by, for example, conductive material which passes through insulative layers 166 and selectively joins conductive layers 164. As such, power, data, and ground are communicated between first interface 156 and second interface 158 of multi-layer substrate 142.

The number of conductive layers 164 and insulative layers 166 of multi-layer substrate 142 can vary depending on the number of printhead dies 124 to be mounted on carrier 122 as well as the power and data rate requirements of printhead dies 124.

It is to be understood that the above figures are simplified schematic illustrations of carrier 122, including substructure 140 and multi-layer substrate 142. The illustrative routing of the ink passages (e.g. passage 148) through substructure 140 and multi-layer substrate 142, respectively, and conductive paths 150 through multi-layer substrate 142, for example, has been simplified for clarity of explanation. Although various features of carrier 122, such as the ink passages and conductive paths, are schematically illustrated as being straight, it is understood that design constraints could make the actual geometry more complicated for a commercial embodiment of inkjet printhead assembly 120. Ink passages, for example, may have more complicated geometries to allow multiple colorants of ink to be channeled through the carrier. In addition, conductive paths 150 may have more complicated routing geometries through multi-layer substrate 142 to avoid contact with ink passages 148 and to allow for electrical connector geometries other than the illustrated I/O pins. It is understood that such alternatives are within the scope of the described subject matter.

In one embodiment, metal traces are exposed at the edge of the multi-layer substrate. In accordance with the described embodiments, edge seal processes are utilized to protect the edges of substrates that are intended for use in fluid ejection devices. In one embodiment, the edges of these substrates have exposed electrical interconnects such as plating tie bars that were utilized in a plating process. Often, these substrates are incorporated in or otherwise comprise multi-chip modules. These multi-chip modules can be utilized in a wide variety of fluid ejection devices. But one exemplary device, and one which is used as an example throughout this document, is the ink jet printing device. It is to be appreciated and understood, however, that the described techniques can be employed in the context of substrates that are to be utilized in other, different fluidic devices.

One such environment is the medical device environment. For example, such substrates can be employed in implantable devices.

In accordance with the embodiments described below, a sealant material is applied over one or more edges of a substrate that is intended for use in a fluidic device. The term "sealant material" is intended to include one or more different types of sealant material. In addition, the sealant material can be applied in more than one application step. The sealant material is then exposed to conditions effective to seal the edge or edges over which it is applied. Any suitable sealant material can be used. In examples described below, the sealant material comprises an adhesive material, specific examples of which are given. Given that various sealant materials can be used, such materials can be applied over the substrate edges in various ways. For example, some types of sealant material can reside in a flowable state. Accordingly, these materials can be flowed or otherwise provided over the edges of interest and further processed to seal the edges. Yet other sealant materials can reside in the form of a sheet that is paid out or otherwise dispensed over the edge or edges of interest and further processed to seal the edges.

In the embodiments described below, the various processes for sealing the edge or edges of the substrate are directed to sealing the surface area comprising the edge or edges. Although some sealant material can be provided over other portions of the substrate, such as over a surface that joins with an edge, in one embodiment, to the extent possible, sealant material is provided over those edge areas of interest. In another embodiment, sealant material is provided over less than an entirety of the substrate. Accordingly, this particular embodiment differs from other sealing techniques that are utilized to seal the entirety of the substrate, such as with an encapsulating material.

First Exemplary Embodiment

Figure 2:
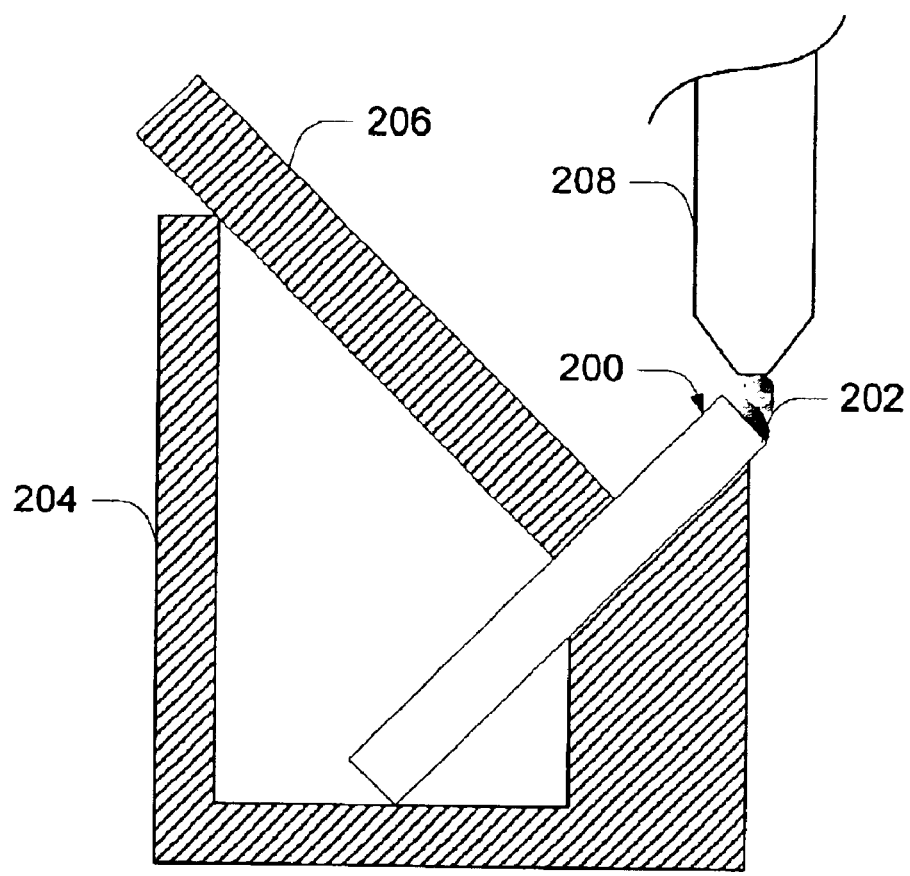
FIG. 2 is a diagram of one exemplary embodiment that can be utilized to apply sealant material over a substrate edge.

Referring to FIG. 2, a first embodiment for applying sealant material to an edge of a substrate 200 is illustrated. In the illustrated and described embodiment, substrate 200 comprises a multi-layer ceramic substrate that is to be utilized in a fluid ejection device. It is to be appreciated, however, that other types of substrates can be utilized as, for example, printed circuit board substrates.

Here, substrate 200 comprises one or more edges that are to be sealed. An exemplary edge is shown at 202. As noted above, these substrates are often characterized in that they have exposed conductive or metal traces at their edges as a result of the processing that the substrate undergoes (e.g. electrolytic plating). Substrate 200 is placed into a suitable holding structure, such as a jig 204, 206, and sealant material is applied over edge 202 to effectively coat or cover the edge. In this example, the sealant material comprises a flowable adhesive material that is flowed over the edge. Any suitable technique can be used to flow the adhesive material over the edge. Here, a dispensing needle 208 is brought into close proximity with the edge and the adhesive material is dispensed from the needle onto the edge. Any suitable amount of dispensing material can be utilized. In this example, a thin layer (e.g. around about 0.005-inches or 130 microns) is used. In one embodiment, a suitable, commercially available adhesive material is Emerson & Cuming 3255 adhesive material. In an additional embodiment, a self-curing epoxy could be used. In one embodiment, after application of the sealant material, the material can be exposed to conditions that are effective to provide the sealant material into a non-flowable state.

In this example, after application of the adhesive material, the substrate can be cured as, for example, by being placed into a suitable curing oven and cured for a suitable period of time. In the above example, curing at a temperature from between about 100 to 150 degrees C. for a period of about one hour can be sufficient. Curing times and methods can, however, vary as one varies the material that is utilized to seal the substrate's edge or edges. For example, some materials can be cured through ultraviolet techniques as well as other techniques that will be understood by those of skill in the art.

Second Exemplary Embodiment

Figure 3:
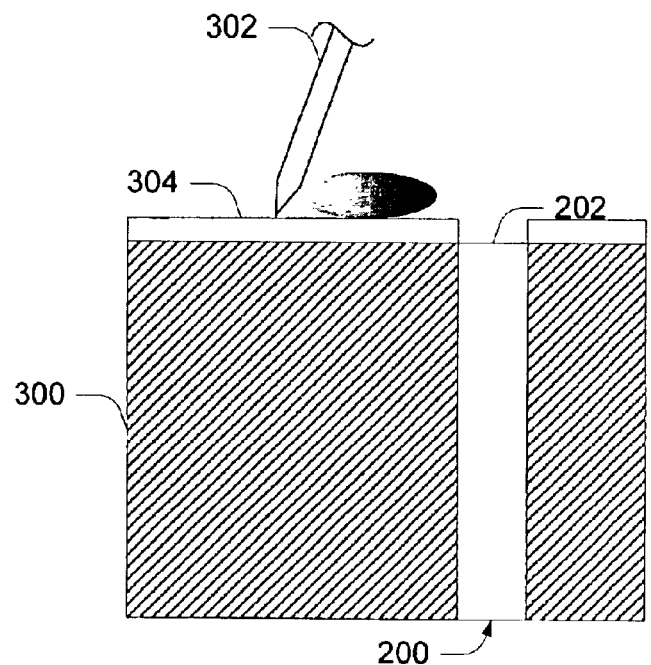
FIG. 3 is a diagram of one exemplary embodiment that can be utilized to apply sealant material over a substrate edge.
Figure 4:
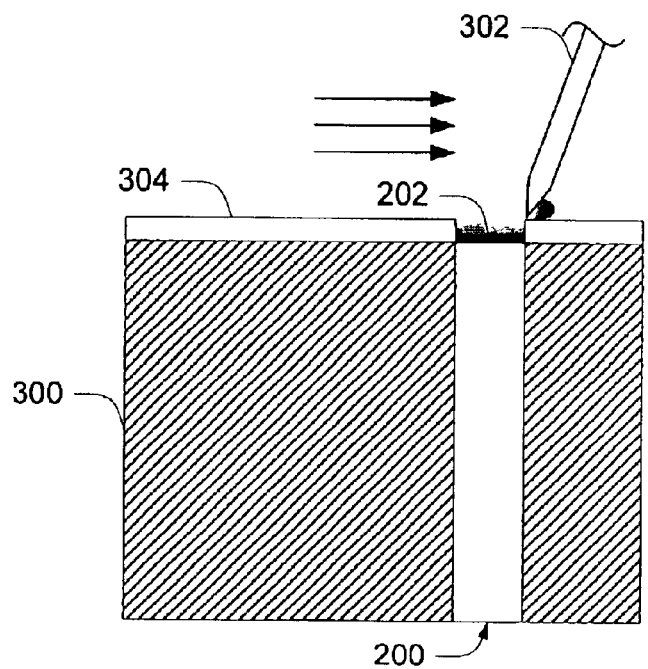
FIG. 4 is a diagram of the FIG. 3 embodiment at a different point in the application process depicted in FIG. 3.

Referring to FIGS. 3 and 4, a second embodiment for applying sealant material to an edge of a substrate 200 is illustrated.

Here, substrate 200 comprises one or more edges that are desired to be sealed. An exemplary edge is shown at 202. Typically, as noted above, these substrates are characterized in that they have exposed metal traces at their edges as a result of the processing that the substrate undergoes (e.g. electrolytic plating).

In this example, substrate 200 undergoes a screen printing process to apply the sealant material over one or more edges of the substrate. Accordingly, as shown in FIG. 3, the substrate is placed into a suitable holding structure 300 and a print mask 304 is provided over the substrate and has an opening such that the substrate edge over which the sealant material is to be applied is exposed. Sealant material is then provided onto the print mask and a blade or other device 302 is utilized to engage the sealant material and spread it over the print mask. As an example, consider FIG. 4. There, blade 302 engages the sealant material and moves it over the print mask in the direction of the arrows. Accordingly, when the sealant encounters the opening in the print mask, it flows into the mask opening and over the substrate edge that is to be sealed. Any suitable sealant material can be utilized. In this example, the sealant material comprises a flowable adhesive material that is screen printed onto the edge of the substrate that is to be sealed. In one embodiment, a suitable adhesive material is Loctite 3565 adhesive material.

Alternately considered, the process illustrated in FIGS. 3 and 4 can be described as follows. Substrate 200 is supported in a position in which sealant material can be provided over an edge that is to be sealed. A mask opening is provided over the edge that effectively exposes the substrate edge of interest. With other surfaces of the substrate being covered or otherwise protected from the sealant material, sealant material is formed over the mask opening sufficient to cover the substrate's exposed edge. In one embodiment, the sealant material is then exposed to conditions effective to cure or otherwise provide the sealant material into a non-flowable state.

In this example, after application of the adhesive material, the substrate can be cured as, for example, by being placed into a suitable curing oven and cured for a suitable period of time. In the above example, curing at a temperature from between about 100 to 150 degrees C. for a period of about one hour can be sufficient. Curing times and methods can, however, vary as one varies the material that is utilized to seal the substrate's edge or edges. For example, some materials can be cured through ultraviolet techniques as well as other techniques that will be understood by those of skill in the art.

Third Exemplary Embodiment

Figure 5:
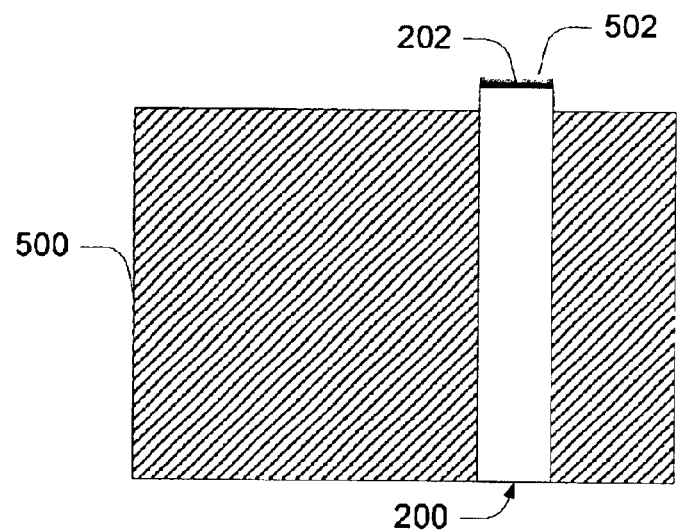
FIG. 5 is a diagram of one exemplary embodiment that can be utilized to apply sealant material over a substrate edge.

Referring to FIG. 5, a third embodiment for applying sealant material to an edge of substrate 200 is illustrated.

In this example, the substrate is provided into a suitable holding structure 500 that exposes not only the edge of the substrate that is to be sealed, but a small portion of adjacent surfaces of the substrate. Here, sealant material in the form of an adhesive decal or sheet is provided and applied over the surface to be sealed. The decal is suitably dimensioned in length and width to cover the edge of the substrate. The decal or sheet can be dimensioned such that it corresponds to the dimensions of the edge that it is to be used to cover, prior to application to the edge. Alternately, the decal or sheet can be applied to the edge and then cut so that it is correspondingly dimensioned.

Any suitable material can be used for the decal or sheet. In the present example, a pressure sensitive tape (Part Nos. 9495MP, 9456, and 9495 LE) available from 3M can be utilized.

In this example, after application of the decal or sheet, the substrate can be cured as, for example, by being placed into a suitable curing oven and cured for a suitable period of time. In the above example, curing at a temperature from between about 100 to 150 degrees C. for a period of about one hour can be sufficient. Curing times and methods can, however, vary as one varies the material that is utilized to seal the substrate's edge or edges. For example, some materials can be cured through ultraviolet techniques as well as other techniques that will be understood by those of skill in the art.

Fourth Exemplary Embodiment

Figure 6:
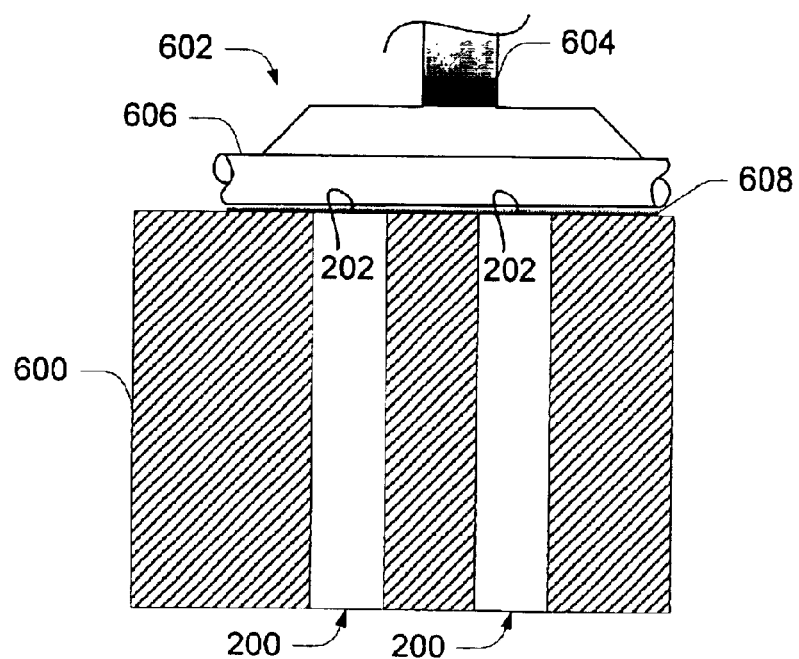
FIG. 6 is a diagram of one exemplary embodiment that can be utilized to apply sealant material over a substrate edge.

Referring to FIG. 6, a fourth embodiment for applying sealant material to edges of respective substrates 200 is illustrated.

In this example, substrates 200 are provided into a suitable holding structure 600 that maintains the substrates in a disposition in which the sealant material can be applied over the edges of interest. In this example, a roller assembly 602 comprises a supply of sealant material 604 that is provided onto a roller 606 that is rolled over the substrate edges that are desired to be covered with the sealant material. As the roller is moved over the edges, sealant material is dispensed onto the edges as shown at 608. In this example, the roller's direction of movement is into and out of the plane of the page upon which FIG. 6 appears.

Any suitable sealant material can be utilized. In this example, the sealant material comprises a flowable adhesive material that is rolled onto the edges of the substrates that are to be sealed. In one embodiment, a suitable adhesive material is Loctite 3565 adhesive material. The sealant material is then exposed to conditions effective to cure or otherwise provide the sealant material into a non-flowable state.

In this example, after application of the adhesive material, the substrate can be cured as, for example, by being placed into a suitable curing oven and cured for a suitable period of time. In the above example, curing at a temperature from between about 100 to 150 degrees C. for a period of about one hour can be sufficient. Curing times and methods can, however, vary as one varies the material that is utilized to seal the substrate's edge or edges. For example, some materials can be cured through ultraviolet techniques as well as other techniques that will be understood by those of skill in the art.

Exemplary Method

Figure 7:
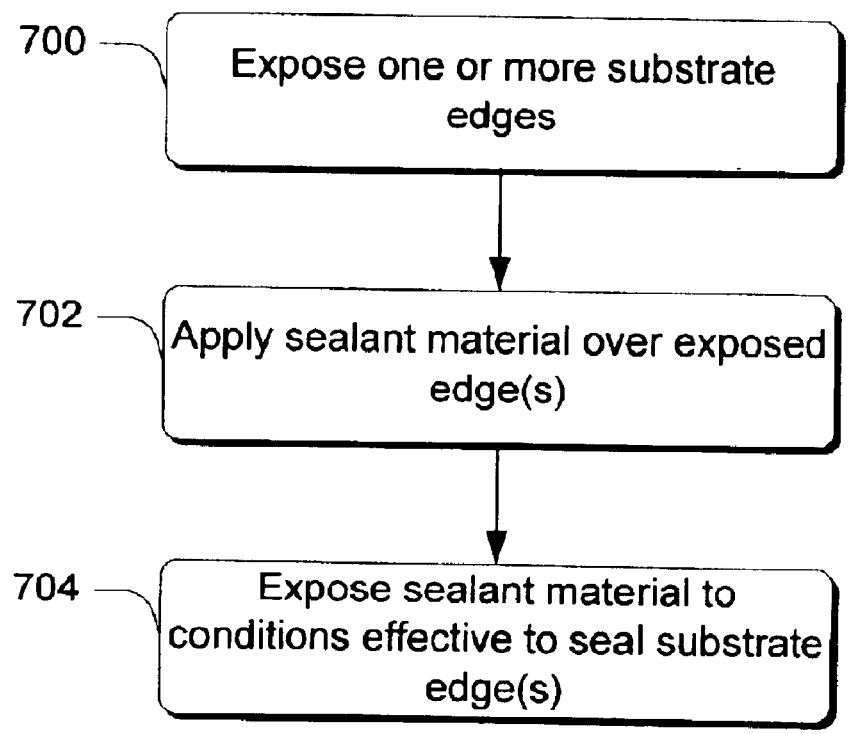
FIG. 7 is a flow diagram that describes steps in a sealant-application method in accordance with one or more embodiments.

FIG. 7 is a flow diagram that describes steps in a method in accordance with one or more embodiments. The described method is employed to seal one or more substrate edges on substrates that are intended to be utilized in fluidic devices.

Step 700 exposes one or more substrate edges that are desired to be sealed. Often, these edges contain exposed metal traces. Any suitable techniques can be utilized to expose the edge or edges. For example, in various embodiments described above, substrate edges are exposed by placing the substrate in a suitable holding structure that maintains at least the edge of interest exposed. The substrate edge can be exposed through an opening in a masking layer. For example, FIGS. 3 and 4 illustrate an embodiment in which a masking layer has an opening that exposes the substrate edge of interest.

In this embodiment, step 702 applies sealant material over the exposed edge(s). Any suitable technique can be utilized to apply the sealant material and any suitable sealant material can be utilized. For example, the sealant material can be applied in multiple application steps. Further, multiple different types of sealant material can be utilized. For example, sealant material comprising a flowable type of sealant material can be applied by flowing it over the edge(s) of interest. Any suitable technique for flowing such a material can be utilized. For example, FIG. 2 shows a technique in which the flowable material is flowed out of a dispensing needle and onto the substrate's edge. FIGS. 3 and 4 show a technique in which the flowable material is flowed over the substrate's edge via a screen printing process. FIG. 6 shows a technique in which flowable material is flowed over the substrate's edge via a roller assembly that includes a roller and a supply of sealant material. FIG. 5 shows a technique in which the sealant material is not flowable, but rather is provided in the form of an adhesive sheet that is adhesively applied to the substrate edge of interest.

Examples of suitable sealant materials include adhesive materials (both flowable and non-flowable). In one embodiment, characteristics of such materials can include that the materials are electrically insulative and resistant to the effects of fluid that can be encountered in the environments in which the substrates are intended to be used. Specific examples of sealant materials are provided in the examples above.

In this embodiment, step 704 exposes the sealant material to conditions effective to seal the substrate's edge. Examples of such conditions can vary as the types of sealant material varies. For example, the sealant material can comprise a curable material that may or may not need to be subjected to curing conditions in order to effectively seal the substrate's edge. Yet other sealant material, which might be wet when initially applied, can be exposed to conditions that allow it to dry. Yet another type of sealant material can be allowed to sit for a period of time that it sets properly.

CONCLUSION

The various embodiments described above may be used to provide methods and systems for protecting substrates for use in fluid devices. In accordance with at least one described embodiment, edge seal processes are utilized to protect the edges of substrates that are intended for use in fluidic devices.

Although the disclosure has been described in language specific to structural features and/or methodological steps, it is to be understood that the appended claims are not limited to the specific features or steps described. Rather, the specific features and steps are exemplary forms of implementing this disclosure.

What is claimed is:

1. A method comprising:

applying sealant material over one or more edges of at least one multi-layer substrate, at least one edge having an exposed electrical interconnect, the sealant material being applied over less than an entirety of the substrate and sufficiently to cover the exposed electrical interconnect;

exposing the sealant material to conditions effective to seal the electrical interconnect from ink ingression to the electrical interconnect; and, forming multiple ink ejection nozzles over the multi-layer substrate to form an ink ejection assembly.

2. The method of claim 1, wherein the substrate comprises a multi-layer ceramic substrate.

3. The method of claim 1, wherein the sealant material comprises an adhesive material.

4. The method of claim 1, wherein the sealant material comprises a flowable material.

5. The method of claim 1, wherein the sealant material comprises a flowable, adhesive material.

6. A method comprising:

suspending a multi-layer substrate over an electrolytic bath by at least one tie bar;

removing a portion of individual tie bars such that the tie bar terminates proximate an exposed edge of the multi-layer substrate;

applying sealant material over the exposed edge of the multi-layer substrate; and, exposing the sealant material to conditions effective to seal the exposed edge to ink ingression to the tie bars.

7. The method of claim 6, wherein the sealant material comprises an adhesive material.

8. The method of claim 6, wherein the sealant material comprises a flowable material.

9. The method of claim 6, wherein the sealant material comprises a flowable, adhesive material.

10. The method of claim 6, wherein the multi-layer substrate is configured to include one or more fluid ejection nozzles.

11. The method of claim 6, wherein the multi-layer substrate comprises a multi-layer ceramic substrate.

12. The method of claim 6, wherein the act of applying comprises positioning a dispensing needle proximate said exposed edge and dispensing sealant material from said dispensing needle onto said exposed edge.

13. The method of claim 6, wherein the act of exposing said sealant material comprises curing the sealant material.

* * * * *

UNITED STATES PATENT AND TRADEMARK OFFICE
CERTIFICATE OF CORRECTION

PATENT NO. : 6,951,778 B2  
APPLICATION NO. : 10/284825  
DATED : October 4, 2005  
INVENTOR(S) : Mohammad Akhavain et al.

It is certified that error appears in the above-identified patent and that said Letters Patent is hereby corrected as shown below:

In column 11, line 21, after "time" insert -- to ensure --.

Signed and Sealed this

Twenty-eighth Day of July, 2009

JOHN DOLL  
*Acting Director of the United States Patent and Trademark Office*